United States Patent
Takahashi

(10) Patent No.: US 7,187,605 B2
(45) Date of Patent: Mar. 6, 2007

(54) SEMICONDUCTOR STORAGE DEVICE

(75) Inventor: Takeo Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 355 days.

(21) Appl. No.: 10/747,400

(22) Filed: Dec. 30, 2003

(65) Prior Publication Data

US 2005/0003603 A1    Jan. 6, 2005

(30) Foreign Application Priority Data

Jul. 1, 2003    (JP) ............................. 2003-189403

(51) Int. Cl.
*G11C 7/00* (2006.01)
(52) U.S. Cl. ...................... 365/203; 365/104
(58) Field of Classification Search ...................... None
See application file for complete search history.

(56) References Cited

U.S. PATENT DOCUMENTS

| | | | | |
|---|---|---|---|---|
| 4,388,702 A | * | 6/1983 | Sheppard | .................... 365/104 |
| 4,771,284 A | * | 9/1988 | Masleid et al. | ................ 326/41 |
| 5,001,668 A | * | 3/1991 | Ito et al. | ................. 365/185.25 |
| 5,018,103 A | * | 5/1991 | Pomper et al. | ............. 365/104 |
| 6,404,666 B1 | * | 6/2002 | Uchida | ........................ 365/104 |
| 6,618,282 B1 | * | 9/2003 | Poplevine et al. | ............ 365/94 |
| 6,738,280 B2 | * | 5/2004 | Satomi | ........................ 365/94 |

FOREIGN PATENT DOCUMENTS

| | | |
|---|---|---|
| JP | 04-209396 | 7/1992 |
| JP | 2002-323928 | 11/2002 |

* cited by examiner

*Primary Examiner*—Son L. Mai
(74) *Attorney, Agent, or Firm*—Volentine Francos & Whitt, PLLC

(57) ABSTRACT

A mask ROM small in circuit scale and low in consumption power has an n-type select transistor having a drain connected to a corresponding one of bit lines, a source connected to a data line, and a gate having a corresponding one of select signals input thereto. A p-type precharge transistor has a drain connected to a corresponding one of bit lines, a source connected to a power line, and a gate having a corresponding one of the select signals input thereto. Because the bit line is precharged by using a precharge transistor opposite in conductivity type to the select transistors, it is satisfactory to provide one precharge transistor for one bit line, greatly reducing the circuit scale.

11 Claims, 7 Drawing Sheets

SEMICONDUCTOR STORAGE DEVICE

BACKGROUND OF THE INVENTION

1. Field of the Invention

This invention relates to semiconductor storage devices, such as mask ROMs (Read Only Memories).

2. Description of the Related Art

Mask ROMs, for example, are known as semiconductor storage devices. The mask ROM is a read-only semiconductor storage device having a storage value written into a memory cell in the manufacture stage thereof.

FIG. 1 is a circuit diagram showing one configuration example of a conventional mask ROM 600.

As shown in FIG. 1, memory cell transistors T11, ... Tnm of a memory cell array 610 are connected at the gate to the corresponding word line (any of WL1, WL2, ..., WLn) and at a drain to the corresponding bit line (any of BL1, BL2, ..., BLn). Meanwhile, transistors T12, T21, ... in part are grounded at the sources whereas the other transistors T11, T22, ... are held in a floating state at the sources. In the mask ROM 600, data is written by grounding/floating the sources. As explained later, when to set the reading potential of the memory cell transistor at low level, the relevant memory cell transistor is grounded at the source. Conversely, when to set the read potential of the memory cell transistor at high level, the relevant memory cell transistor is set in a floating state at the source.

For example, when selecting the word line WL1, the potential on the word line WL1 is set at VDD (i.e. high level) while the potentials on the other word lines WL2–WLn are set at ground level (i.e. low level). Consequently, the memory cell transistors T11, T12, ... T1m connected to the word line WL1 are all turn on whereas the memory cell transistor connected to the other word lines WL2–WLn are all turn off.

Meanwhile, when selecting the bit line BL1 for example, low level is inputted as a select signal S1 while high level is inputted as the other select signals S2–Sm. Due to this, the select transistor 620-1 turns on but the other select transistors 620-2–620-m are maintained in the off state. Accordingly, the data line DL is placed in conduction only with the bit line BL1 but out of conduction with the other bit lines BL2–BLm.

Each of the precharge circuits 630-1–630-m, only when the corresponding select signal (any of S1–Sm) is at high level, applies a precharge potential VDD to the corresponding bit line (any of BL1–BLm). Consequently, when the bit line BL1 is selected for example, the bit line BL1 is not applied by the potential VDD but the other bit lines BL2–BLm are applied by the potential VDD. It is noted that, before reading, all the bit lines BL1–BLm are set at the initial potential VDD.

Herein, consideration is made on the case to read a storage value out of the memory cell transistor T12. In this case, selected are the word line WL1 and the bit line BL2. When the bit line BL2 is selected (see t1 in FIG. 2A, 2B), the precharge circuit 630-2 turns off while the other precharge circuits 630-1, 630-3–630-m turn on. Herein, the memory cell transistor T12 is grounded at the source. In addition, because the precharge circuit 630-2 is off, no current is supplied onto the bit line BL2. Accordingly, in case the memory cell transistor T12 turns on, the potential over the bit line BL2 gradually lowers (see FIG. 2A). Due to this, the output potential over the data line DL also gradually lowers. Meanwhile, when the word line WL1 is selected, the memory cell transistor T11 also turns on. However, because the memory cell transistor T11 is being set in a floating state at the source, the potential on the bit line BL1 is maintained at VDD (see FIG. 2B).

Meanwhile, when to read a storage value out of the memory cell transistor T11, selected are the word line WL1 and the bit line BL1. When the bit line BL1 is selected (see t1 in FIG. 2C, 2D), the precharge circuit 630-1 turns off while the other precharge circuits 630-2–630-m turn on. Herein, the memory cell transistor T11 is being set in a floating state at the source. Consequently, even if the memory cell transistor T11 turns on, the potential on the bit line BL1 is maintained at VDD. Accordingly, high level is outputted from the bit line BL1 to the data line DL (see FIG. 2C). Meanwhile, when the word line WL1 is selected, the memory cell transistor T12 also turns on. Due to this, the charge stored on the bit line BL2 is released to the ground through the memory cell transistor T12. However, because a current is supplied from the precharge circuit 630-2 onto the bit line BL2, the potential on the bit line BL2 stabilizes at a value somewhat lower than VDD (see FIG. 2D).

In this manner, in the mask ROM 600, the non-selected bit line is maintained at a voltage nearby VDD by the corresponding precharge circuit. This is to prevent against potential drop on the selected bit line.

For example, when reading a storage value out of the memory cell transistor T11, the memory cell transistor T12 also turns on (mentioned above). Consequently, unless the precharge circuit 630-2 is provided, the potential on the non-selected bit line BL2 gradually lowers. In case the potential on the bit line BL2 lowers, there is a possibility that the potential on the bit line BL1 be lowered under the action of coupling capacitance between the bit lines BL1, BL2. Accordingly, there is a possibility that the lowered potential on the non-selected bit line BL2 incurs misreading of the selected bit line BL1.

Because of these reasons, the mask ROM 600 maintains the potential on the non-selected bit lines at a value nearby the reference potential VDD by the use of the precharge circuits 630-1–630-m.

Concerning the circuit for generating a reference potential, there are known those disclosed in JP-A-2002-323928 (Patent Document 1) and Japanese Patent No. 2753144 (Patent Document 2).

However, the reference potential generating circuits disclosed in the Patent Documents 1, 2 have disadvantage that they are great in circuit scale. Consequently, in case such a reference potential generating circuit be adopted for the precharge circuit 630-1–630-m, the mask ROM 600 entirety results in a quite great circuit scale.

In addition, the above mask ROM 600 involves a disadvantage that consumption current is considerably high. This is mainly because the memory cell transistor grounded at the source, even when unselected, causes discharge through the bit line.

Therefore, there is a need for a semiconductor storage device using a precharge circuit small in circuit scale and reduced in consumption power.

SUMMARY OF THE INVENTION

A semiconductor storage device according to a first aspect of the present invention comprises: a memory cell array having a plurality of memory cell transistors arranged in a matrix form; a plurality of word lines respectively connected to control electrodes of the memory cell transistors on the corresponding rows; a plurality of bit lines respectively connected to one main electrodes of the memory cell transistors on the corresponding columns; a data line for selectively outputting a potential on the bit line; a select transistor in a first conductivity type having one main electrode connected to a corresponding one of the bit lines, the other main electrode connected to the data line, and a control electrode for inputting a corresponding select signal; and a precharge transistor in a second conductivity type having one main electrode connected to a corresponding one of the bit lines, the other main electrode connected to a power line, and a control electrode for inputting a corresponding select signal.

According to the first aspect, precharge transistors operable on a reverse logic to the select transistor are provided respectively between the bit lines and the power line. Due to this, by merely providing one precharge transistor for one bit line, precharge is possible to the bit lines.

A semiconductor storage device according to a second aspect of the present invention comprises: a memory cell array having a plurality of memory cell transistors arranged in a matrix form; a plurality of word lines respectively connected to control electrodes of the memory cell transistors on the corresponding rows; a plurality of bit lines respectively connected to one main electrodes of the memory cell transistors on the corresponding columns; a data line for selectively outputting a potential on the bit line; a select transistor having one main electrode connected to a corresponding one of the bit lines, the other main electrode connected to the data line, and a control electrode for inputting a corresponding select signal; and a precharge circuit having a precharge transistor having one main electrode connected to a corresponding one of the bit lines and the other main electrode connected to a power line, and a precharge control circuit for causing the precharge transistor to turn on only when the select signal represents non-selection and a difference between a potential on a corresponding one of the bit lines and a potential on the power line is greater than a predetermined value.

According to the second second aspect, the precharge circuit is configured to make a precharge to the bit line only when the select signal represents non-selection and a difference between a potential on a corresponding one of the bit lines and a potential on the power line is greater than a predetermined value. Due to this, a potential on a non-selected bit line can be lowered, so that a current discharged through the non-selected bit line to the ground is made smaller, resulting in reducing consumption power.

DETAILED DESCRIPTION OF THE INVENTION

Embodiments of the present invention will now be described on the examples that the present invention is applied to mask ROMs. Note that, in the figure, the sizes and shapes of and the arrangement relationship between the constituent components are merely the schematic showings to the extent the invention is to be understood, while the numerical conditions given in the ensuing description constitute nothing more than exemplifications.

First Embodiment

Figure 3:
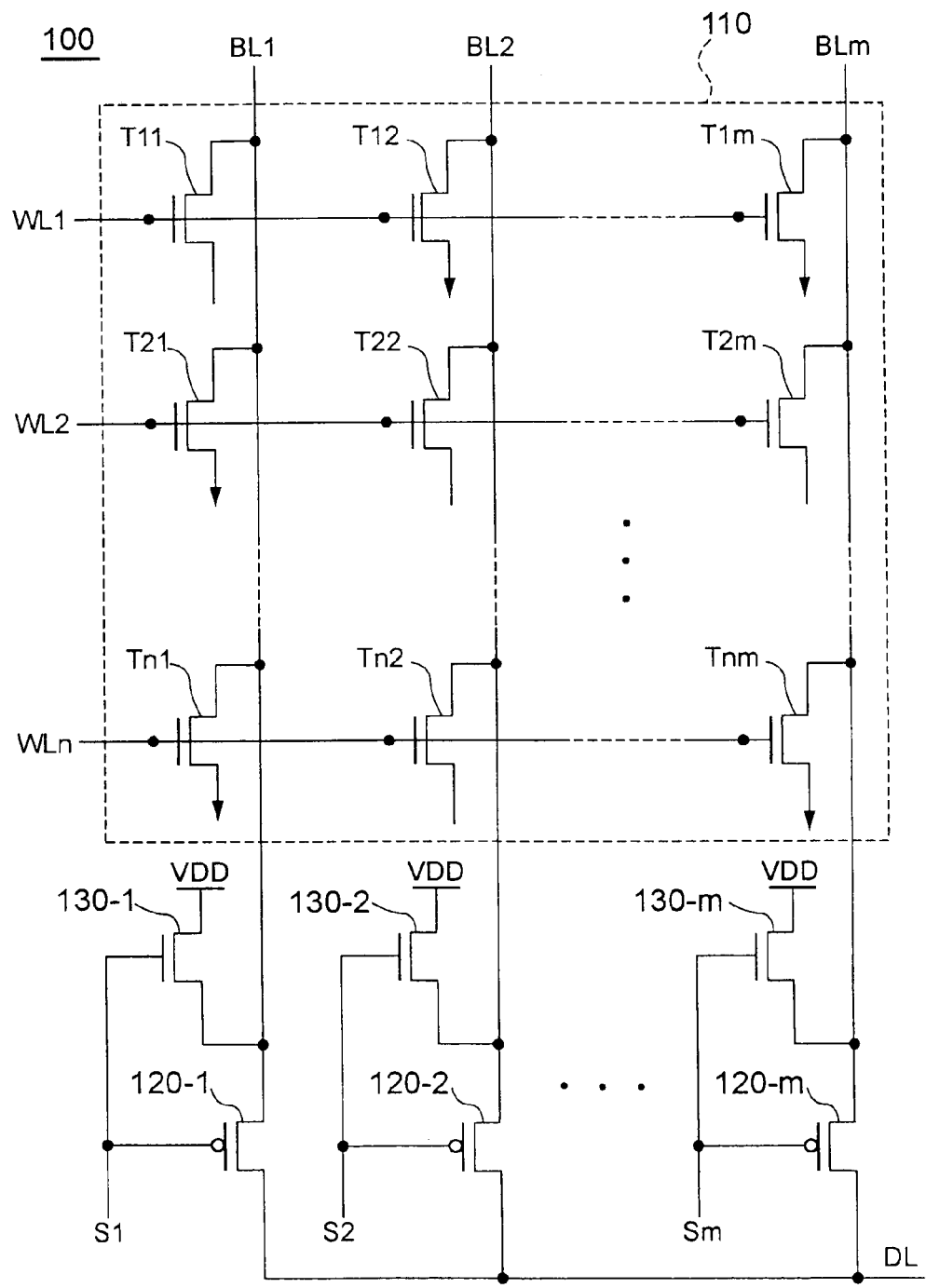
FIG. 3 is a circuit diagram schematically illustrating a configuration of a semiconductor storage device according to a first embodiment.

FIG. 3 is a circuit diagram schematically illustrating a configuration of a mask ROM according to a first embodiment.

As shown in FIG. 3, a mask ROM 100 of this embodiment has a memory cell array 110, word lines WL1, WL2, . . . , WLn in the number of n, bit lines BL1, BL2, . . . , BLm in the number of m, select transistors 120-1, 120-2, . . . , 120-m in the number of m, precharge transistors 130-1, 130-2, 130-m in the number of m, and a data line DL.

Figure 1:
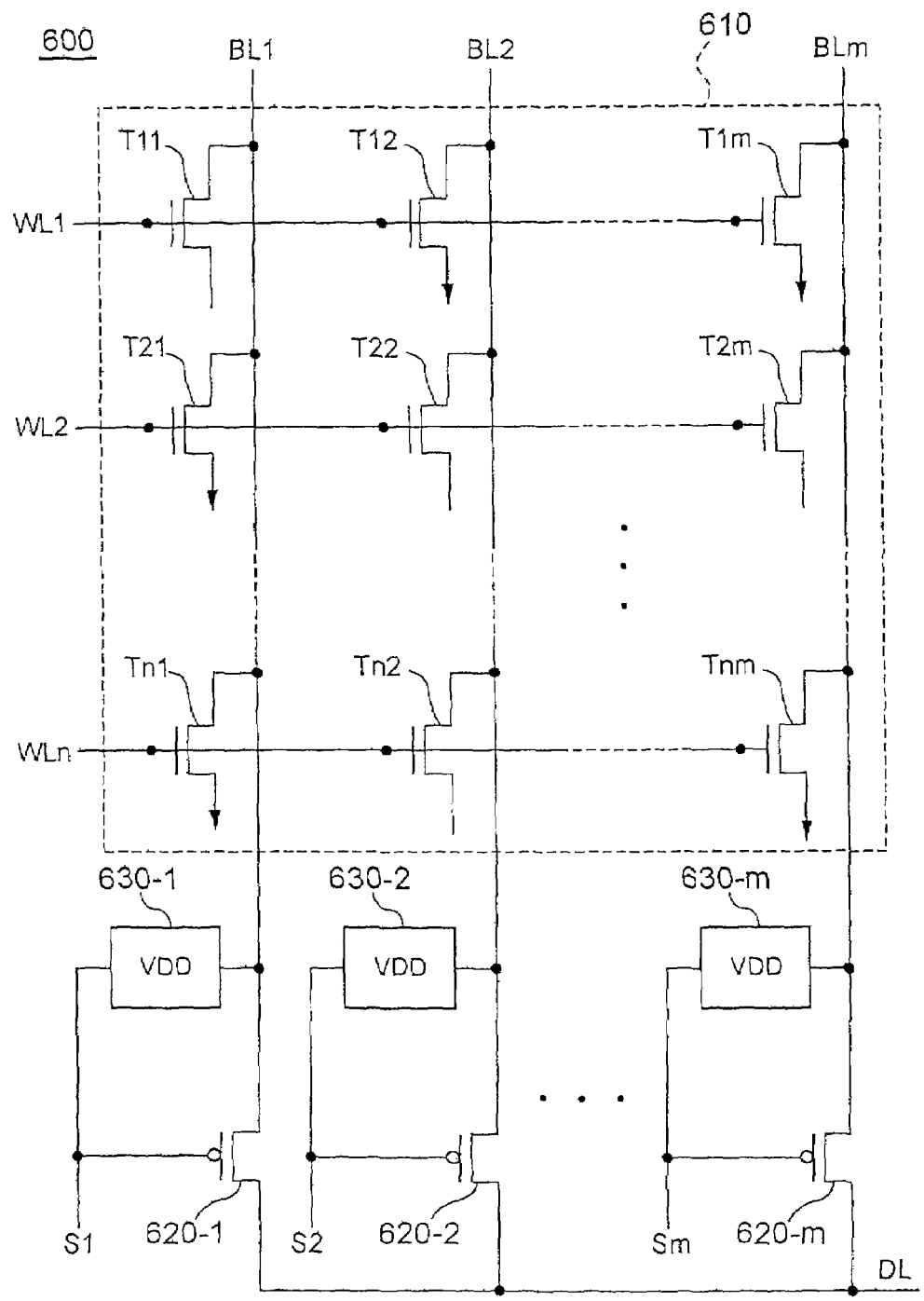
FIG. 1 is a circuit diagram schematically illustrating a configuration example of a conventional semiconductor storage device.

The memory cell array 110 has memory cell transistors T11–Tnm in the number of n×m. These memory cell transistors T11–Tnm are arranged in a matrix form. In this embodiment, the memory cell transistors T11–Tnm use nMOS transistors. Similarly to the conventional mask ROM 600 (see FIG. 1), data can be written to the memory cell transistors T11–Tnm by grounding/floating them at sources. To set a read potential on the memory cell transistor to low level, the relevant memory cell transistor is grounded at the source. Conversely, to set a read potential on the memory cell transistor to high level, the source of the relevant memory cell transistor is set to a floating state.

The word lines WL1–WLn are provided on a row-by-row basis of the memory cell array 110. These word lines WL1–WLn are respectively connected to the gates of the memory cell transistors arranged on the corresponding rows.

The bit lines BL1–BLm are provided on a column-by-column basis of the memory cell array 110. These bit lines BL1–BLm are respectively connected to the drains of the memory cell transistors arranged on the corresponding columns.

The select transistors 120-1–120-m are provided respectively on the bit lines BL1–BLm. In this embodiment, the select transistors 120-1–120-m use pMOS transistors. The select transistor 120-1–120-m has a source connected to the corresponding bit line BL1–BLm and a drain connected to the data line DL. Meanwhile, the select transistor 120-1–120-m has a gate to which a corresponding select signal (any of S1–Sm) is to be inputted.

The precharge transistors 130-1–130-m are provided respectively on the bit lines BL1–BLm. In this embodiment, the precharge transistors 130-1–130-m use nMOS transistors. The precharge transistor 130-1–130-m has a source connected to the corresponding bit line BL1–BLm and a drain connected to a power line VDD. Meanwhile, the precharge transistor 130-1–130-m has a gate to which a corresponding select signal (any of S1–Sm) are to be inputted.

The operation of the mask ROM 100 shown in FIG. 3 is now described.

When to read the memory cell transistor T11 for example, selected are a word line WL1 and a bit line BL1.

When to select the word line WL1, this word line WL1 is set at high level while the other word lines WL2–WLn are set at low level in potential.

Consequently, all the memory cell transistors T11, T12, ..., T1m connected to the word line WL1 turn on while all the memory cell transistors connected to the other word lines WL2–WLn turn off.

Meanwhile, when selecting the bit line BL1, low level is inputted as a select signal S1 while high level is inputted as the other select signals S2–Sm.

The select transistor 120-1–120-m, because of pMOS, turns on when the gate potential is at low level and turns off when the gate potential is at high level. Accordingly, when the select signal S1 is at low level in potential and the select signals S2–Sm are at high level, the select transistor 120-1 turns on but the other select transistors 120-2–120-m is maintained in the off state. Consequently, the data line DL is in conduction only with the bit line BL1 but it is out of conduction with the other bit lines BL2–BLm.

Meanwhile, the precharge transistor 130-1–130-m, because of nMOS, turns on when the gate potential is at high level and turns off when the gate potential is at low level. Accordingly, when the select signal S1 is at low level and the select signals S2–Sm are at high level, the precharge transistor 130-1 turns off while the other precharge transistors 130-2–130-m turn on. Consequently, the bit line BL1 is not applied by the potential VDD but the other bit lines BL2–BLm are applied by the potential VDD. Incidentally, before reading, all the bit lines BL1–BLm are set at the initial potential VDD.

In this manner, this embodiment employed the transistors opposite in conductivity type to the select transistors 120-1–120-m (i.e. transistors reverse in operation logic) as precharge transistors 130-1–130-m. Accordingly, the select signals S1–Sm can be used, without change, as control signals for the precharge transistors 130-1–130-m.

The principle upon reading a storage value of the memory cell transistor T11–Tnm is similar to that of the conventional mask ROM 600 (see FIGS. 2A–2D), and hence not repeatedly explained.

As explained above, according to the mask ROM 100 of this embodiment, each bit line BL1–BLm can be precharged by merely providing one precharge transistor for one bit line. Accordingly, the mask ROM 100 entirety can be greatly reduced in its circuit scale.

In addition, this embodiment satisfactorily has one precharge transistor for one bit line, thus reducing consumption power as well.

Second Embodiment

Figure 4:
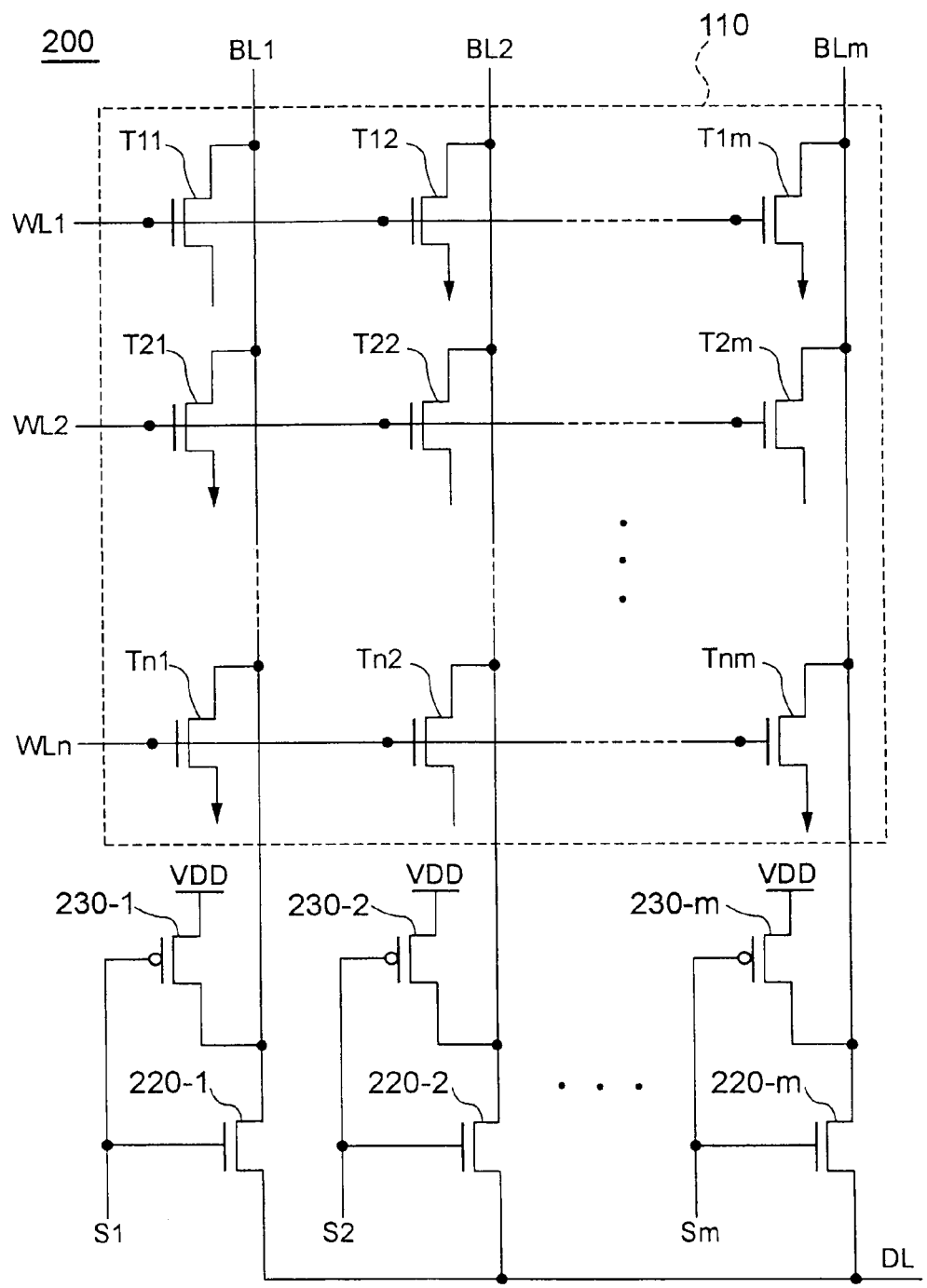
FIG. 4 is a circuit diagram schematically illustrating a configuration of a semiconductor storage device according to a second embodiment.

FIG. 4 is a circuit diagram schematically illustrating a configuration of a mask ROM according to a second embodiment.

In FIG. 4, the constituent elements attached with the same references as those of FIG. 3 designates the same ones as those of FIG. 3. As shown in FIG. 4, a mask ROM 200 of this embodiment uses nMOS transistors as select transistors 220-1, 220-2, ..., 220-m and pMOS transistors as precharge transistors 230-1, 230-2, ..., 230-m.

The operation of the mask ROM 200 shown in FIG. 4 is now described.

When reading the memory cell transistor T11 for example, selected are a word line WL1 and a bit line BL1.

Similarly to the first embodiment, when to select the word line WL1, this word line WL1 is set at high level while the other word lines WL2–WLn are set at low level. Due to this, all the memory cell transistors T11, T12, T1m connected to the word line WL1 turn on while all the memory cell transistors connected to the other word lines WL2–WLn turn off.

Meanwhile, when to select the bit line BL1, high level is inputted as a select signal S1 while low level is inputted as the other select signals S2–Sm. Namely, in this embodiment, the select signals S1–Sm are reverse in logic to those of the first embodiment.

The select transistor 220-1–220-m, because of a nMOS transistor, turns on when the gate potential is at high level and turns off when the gate potential is at low level. Accordingly, when the select signal S1 has a potential at high level and the select signals S2–Sm have a potential at low level, the select transistor 220-1 turns on but the other select transistors 220-2–220-m are maintained in the off state. Consequently, the data line DL is in conduction only with the bit line BL1 but out of conduction with the other bit lines BL2–BLm.

Meanwhile, the precharge transistor 230-1–230-m, because of a pMOS transistor, turns on when the gate potential is at low level and turns off when the gate potential is at high level. Accordingly, when the select signal S1 has a potential at high level and the select signals S2–Sm have a potential at low level, the precharge transistor 230-1 turns off while the other precharge transistors 230-2–230-m are turned on. Consequently, the bit line BL1 is not applied by the potential VDD but the other bit lines BL2–BLm are applied by the potential VDD. Incidentally, before reading, all the bit lines BL1–BLm are set at the initial potential VDD.

In this manner, this embodiment employed the transistors opposite in conductivity type to the select transistors 220-1–220-m (i.e. transistors reverse in operation logic) as precharge transistors 230-1–230-m, similarly to the first embodiment. Accordingly, the select signals S1–Sm can be used, without change, as control signals for the precharge transistors 230-1–230-m.

The principle upon reading a storage value of the memory cell transistor T11–Tnm is similar to that of the conventional mask ROM 600 (see FIGS. 2A–2D), and hence not repeatedly explained.

As explained above, according to the mask ROM 200 of this embodiment, the mask ROM 200 entirety can be greatly reduced in its circuit scale, because of the similar reason to that of the first embodiment.

Third Embodiment

Figure 5:
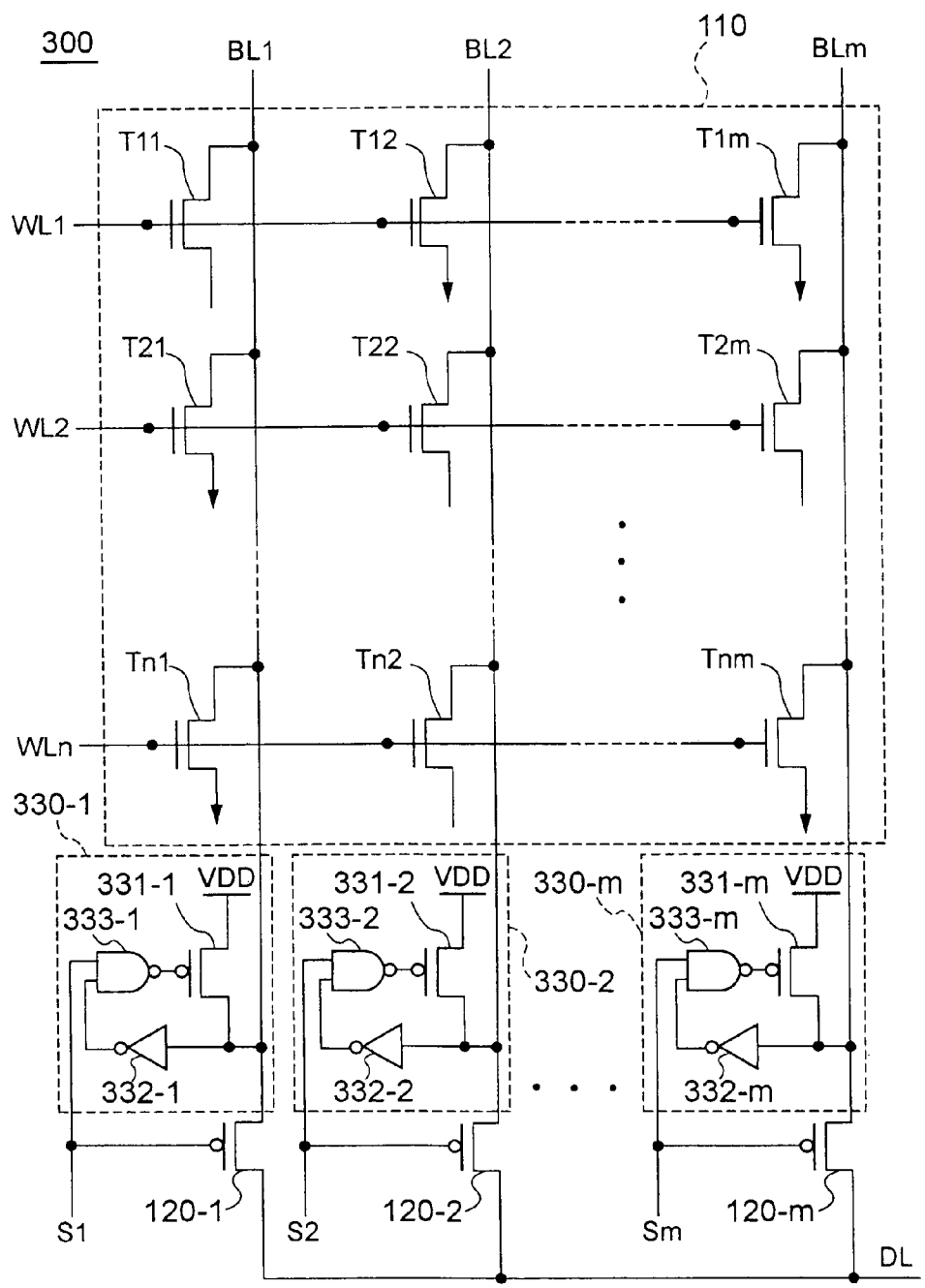
FIG. 5 is a circuit diagram schematically illustrating a configuration of a semiconductor storage device according to a third embodiment.
Figure 6A:
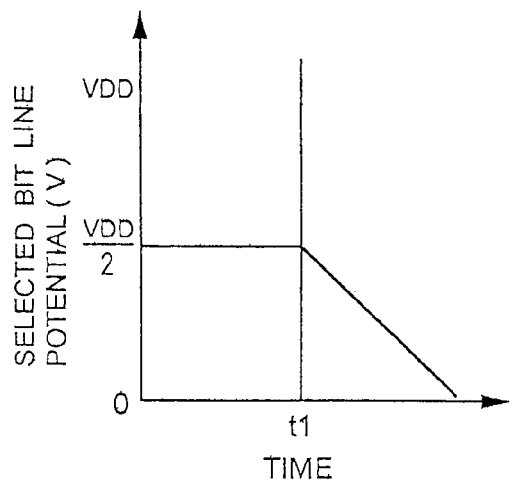
FIGS. 6A–6D are graphs for explaining the operation of the semiconductor storage device of the third embodiment.
Figure 6B:
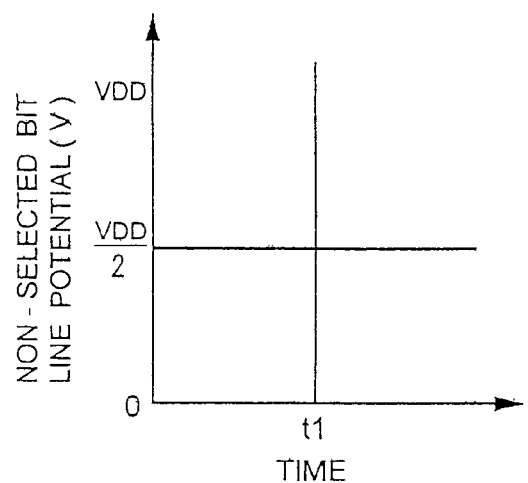
Figure 6C:
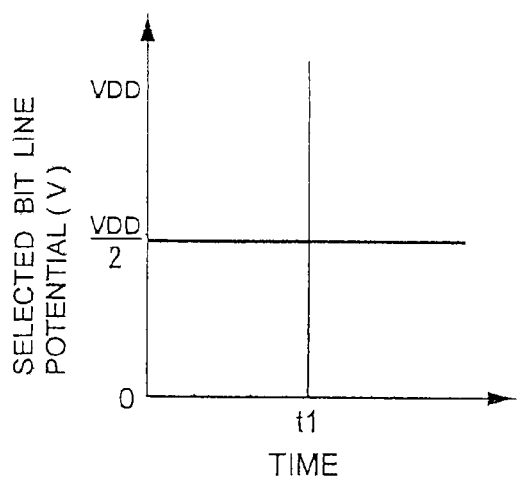
Figure 6D:
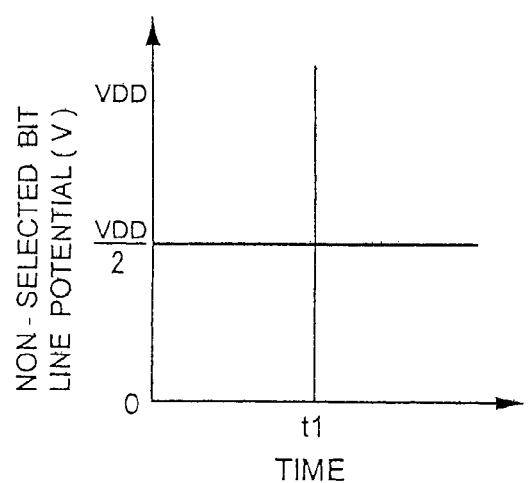

FIG. 5 is a circuit diagram schematically illustrating a configuration of a mask ROM according to a third embodiment. In FIG. 5, the constituent elements attached with the same references as those of FIG. 3 designates the same ones as those of FIG. 3.

As shown in FIG. 5, a mask ROM 300 of this embodiment has precharge circuits 330-1, 330-2, ..., 330-m.

The precharge circuit 330-1 has a precharge transistor 331-1, an inverter 332-1, and an NAND gate 333-1. The inverter 332-1 and NAND gate 333-1 corresponds to a precharge control circuit in this invention.

The precharge transistor 331-1 uses a pMOS transistor. The precharge transistor 331-1 has a drain connected to the corresponding bit line BL1 and a source connected to the power line VDD.

The inverter 332-1 inverts the potential on the corresponding bit line BL1 and outputs the inverted potential. In this embodiment, the inverter 332-1 assumably has an operating threshold VDD/2.

The NAND gate 333-1 has inputs of the corresponding select signal S1 and an output potential of the inverter 332-1. The NAND gate 333-1 has an output potential to be supplied to a gate of the precharge transistor 331-1.

Note that the precharge circuit 330-2–330-*m* is similar in configuration to the precharge circuit 330-1.

The operation of the precharge circuit 330-1–330-*m* is now described on an example that the bit line BL1 is selected. Similarly to the first embodiment, when the bit line BL1 is to be selected, the select signal S1 is set at low level while the select signals S2–Sm are set at high level.

In the precharge circuit 330-1, the NAND gate is inputted by a select signal S1. Because the select signal S1 upon selecting the bit line BL1 is at low level, the NAND gate 333-1 has an output potential fixed at high level regardless of the output potential of the inverter 332-1. Consequently, the precharge transistor 331-1 turns off.

Meanwhile, in the precharge circuit 330-2, the NAND gate 333-2 has select signal S2 at a high level input thereto. As a result, the NAND gate 333-2 will have an output potential logically opposite to the output potential of the inverter 332-2. As noted above, the operating threshold of inverter 332-2 is VDD/2. Consequently, when the potential on the bit line BL2 is smaller than VDD/2, the inverter 332-2 has an output potential at high level. This makes the output potential of the NAND gate 333-2 low in level. Due to this, the precharge transistor 331-2 turns on, to precharge the bit line BL2. Meanwhile, when the potential on the bit line BL2 is equal to or greater than VDD/2, the inverter 332-2 has an output potential at low level, and accordingly the NAND gate 333-2 has an output potential at high level. Due to this, the precharge transistor 331-2 turns off, and the bit line BL2 is not precharged. In this manner, the potential on the non-selected bit line BL2 is fixed at VDD/2.

Incidentally, the operation of the precharge circuit 330-3–330-*m* is similar to the operation of the precharge circuit 330-2.

The overall operation of the mask ROM 300 according to this embodiment is now described by using FIGS. 6A–6D. In FIGS. 6A–6D, t1 represents the timing the bit line is selected.

At first, consideration is made on the case to read a storage value out of the memory cell transistor T12. In this case, selected are the word line WL1 and the bit line BL2. When the bit line BL2 is selected, the precharge circuit 330-2 turns off and the other precharge circuits 330-1, 330-3–330-*m* turn on. Herein, the memory cell transistor T12 is grounded at the source. In addition, because the precharge circuit 330-2 is off, no current is supplied to the bit line BL2. Accordingly, when the memory cell transistor T12 turns on, the potential on the bit line BL2 gradually lowers from VDD/2. Consequently, the output potential on the data DL also gradually lowers from VDD/2 (see FIG. 6A). Meanwhile, when the word line WL1 is selected, the memory cell transistor T11 also turns on. However, because the memory cell transistor T11 is set in a floating state at the source, the potential on the bit line BL1 is maintained at VDD/2 (see FIG. 6B).

Next, consideration is made on the case to read a storage value out of the memory cell transistor T11. In this case, selected are the word line WL1 and the bit line BL1. When the bit line BL1 is selected, the precharge circuit 330-1 turns off and the other precharge circuits 330-2–330-*m* turn on. Herein, the memory cell transistor T11 is set in a floating state at the source. Accordingly, even if the memory cell transistor T11 turns on, the potential on the bit line BL1 is maintained at VDD/2. Consequently, high level is outputted from the bit line BL1 to the data line DL (see FIG. 6C). Meanwhile, when the word line WL1 is selected, the memory cell transistor T12 also turns on. Consequently, the charge stored over the bit line BL2 is released to the ground through the memory cell transistor T12. However, because a current is supplied from the precharge circuit 330-2 to the bit line BL2, the potential on the bit line BL2 stabilizes at VDD/2 (see FIG. 6D).

In this manner, the potential on the non-selected bit line is always fixed at VDD/2 regardless whether connected with a memory cell transistor being grounded at the source.

As described above, according to the mask ROM 300 of this embodiment, the potential on the non-selected bit line can be rendered a half of the power source potential VDD by using the precharge circuit configured simple. Accordingly, in this embodiment, the current flowing from the memory cell transistor (e.g. T12) on a non-selected column to the ground is made smaller than the conventional mask ROM 600 (see FIG. 1). This reduces consumption power.

Figure 2A:
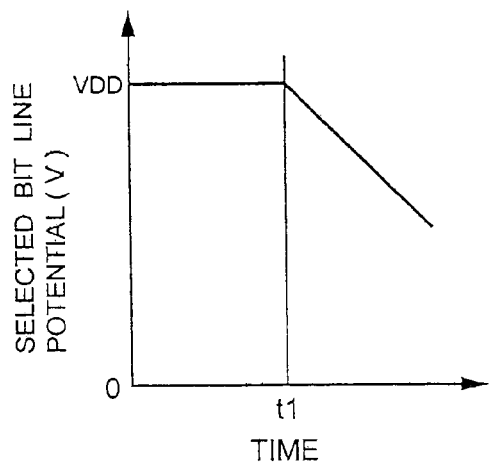
FIGS. 2A–2D are graphs for explaining the operation of the conventional semiconductor storage device.
Figure 2B:
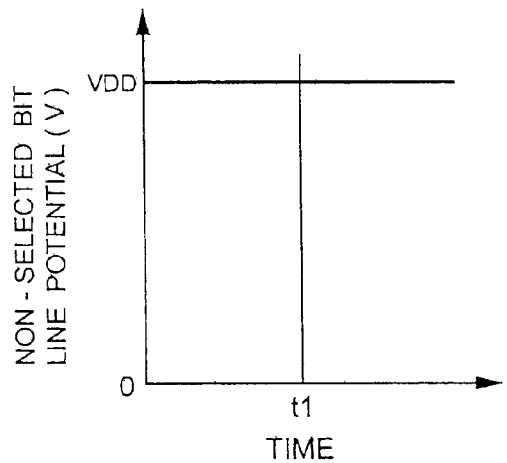
Figure 2C:
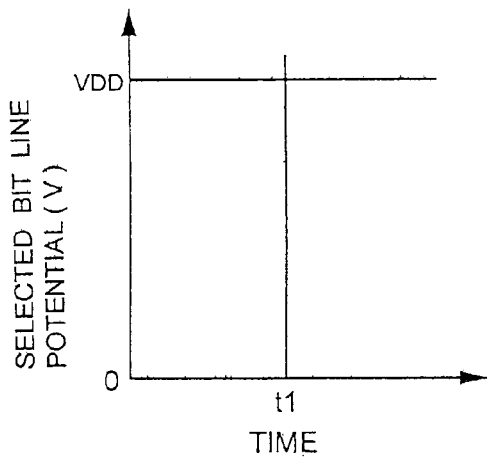
Figure 2D:
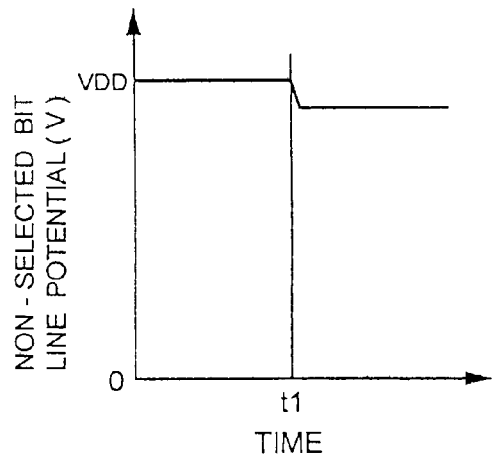

In addition, according to the mask ROM 300 of this embodiment, the potential on a non-selected bit line is always fixed at VDD/2, thus being free from an occurrence of variation as encountered in the conventional mask ROM 600 (see FIG. 2D). Due to this, the coupling capacitance between bit lines as seen from the non-selected bit line stays constant regardless of the storage value of each memory cell transistor T11–Tnm. Accordingly, the mask ROM 300 of this embodiment is easily adjusted for circuit dimensions in the design stage.

Furthermore, by fixing the potential on the non-selected bit line always at VDD/2, the potential read from the selected bit line onto the data line DL is not liable to vary depending upon the storage value of the memory cell transistor T11–Tnm. Accordingly, despite the lowered high level potential, the reliability of read-out value is not worsened so much.

Incidentally, although the precharge potential in this embodiment was set at VDD/2, setting is possible at the other potential than VDD/2. Namely, the precharge potential on the bit line BL1–BLm can be desirably set by adjusting the operating threshold of the inverter 332-1–332-*m*. The operation threshold can be adjusted by the dimensions of the transistor configuring the inverter 332-1–332-*m*, for example.

Fourth Embodiment

Figure 7:
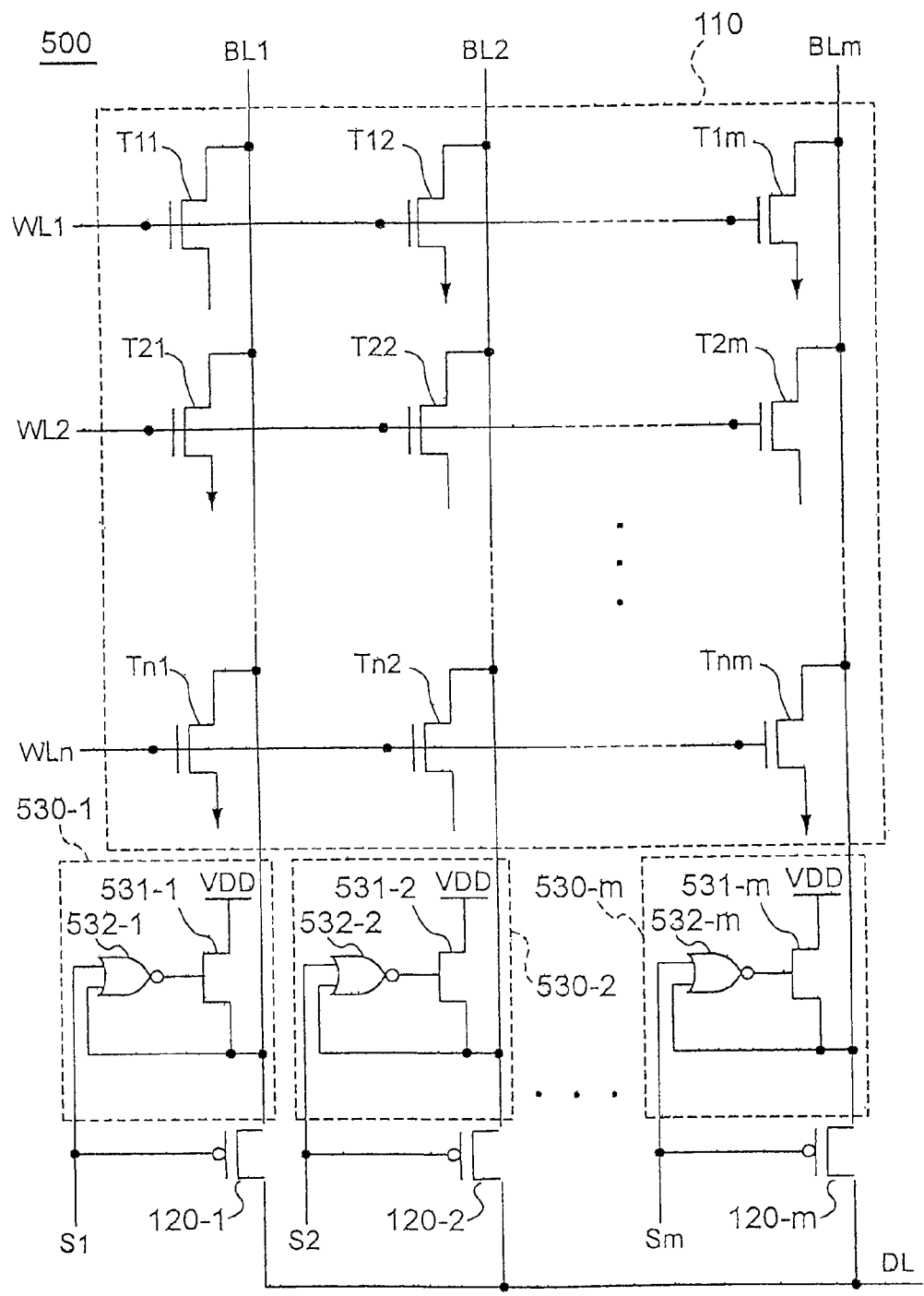
FIG. 7 is a circuit diagram schematically illustrating a configuration of a semiconductor storage device according to a fourth embodiment.

FIG. 7 is a circuit diagram schematically illustrating a configuration of a mask ROM according to a fourth embodiment. In FIG. 7, the constituent elements attached with the same references as those of FIG. 5 designates the same ones as those of FIG. 5.

As shown in FIG. 7, a mask ROM 500 of this embodiment has precharge circuits 530-1, 530-2, . . . , 530-*m*.

The precharge circuit 530-1 has a precharge transistor 531-1 and a NOR gate 532-1. The NOR gate 532-1 corresponds to a precharge control circuit in this invention.

The precharge transistor 531-1 uses a nMOS transistor. The precharge transistor 531-1 has a source connected to the corresponding bit line BL1 and a drain connected to the power line VDD.

The NOR gate 532-1 has inputs of the corresponding select signal S1 and a potential of the bit line BL1. The NOR gate 532-1 has an output potential to be supplied to a gate of the precharge transistor 531-1. In this embodiment, the NOR gate 532-1 assumably has an operating threshold VDD/2. Namely, the NOR gate 532-1 outputs low level when at least one input potential is equal to or greater than VDD/2, and high level when the both input potentials are smaller than VDD/2.

Note that the precharge circuit 530-2–530-m is similar in configuration to the precharge circuit 530-1.

The operation of the precharge circuit 530-1–530-m is now described on an example that the bit line BL1 is selected.

In this embodiment, the select signal corresponding to a selected bit line is set at high level (VDD) while the select signal corresponding to a non-selected bit line is set at low level (ground potential). Namely, in this embodiment, the select signals S1–Sm are reverse in logic to those of the third embodiment.

In the precharge circuit 530-1, the NOR gate 532-1 is inputted by a select signal S1. Because the select signal S1 upon selecting the bit line BL1 is at high level, the NOR gate 532-1 has an output potential fixed at low level regardless of the potential on the bit line BL1. Consequently, the precharge transistor 531-1 turns off.

Meanwhile, low level is inputted as a select signal S2 to the precharge circuit 530-2. At this time, the NOR gate 532-2 has an output potential determined by the potential on the bit line BL2. Namely, when the potential on the bit line BL2 is equal to or greater than VDD/2, the NOR gate 532-2 outputs low level. Consequently, because the precharge transistor 531-2 turns off, precharge is not effected. Meanwhile, when the potential on the bit line BL2 is smaller than VDD/2, the NOR gate 532-2 outputs high level. Consequently, the precharge transistor 531-2 turns on, to effect precharge. In this manner, the potential on the non-selected bit line BL2 is fixed at VDD/2.

Incidentally, the operation of the precharge circuit 530-3–530-m is similar to the operation of the precharge circuit 530-2.

The overall operation during reading in this embodiment is similar to that of the third embodiment, and hence the explanation thereof will not be repeated.

In this manner, this embodiment can provide a mask ROM small in consumption power and easy to adjust circuit dimensions because of the similar reason to the third embodiment.

In addition, this embodiment can further reduce circuit scale smaller than the third embodiment in an amount the precharge circuit does not require an inverter.

Incidentally, precharge potential can be, of course, set at the other potential than VDD/2 similarly to the third embodiment.

As described above, according to the present invention, it is possible to provide a semiconductor storage device small in circuit scale and low in consumption power.

This application is based on Japanese Patent Application No. 2003-189403 which is herein incorporated by reference.

What is claimed is:

1. A semiconductor storage device comprising:
a memory cell array having a plurality of memory cell transistors arranged in a matrix form and having storage values written therein by connecting/disconnecting first main electrodes of the memory cell transistors to/from a first power line;
a plurality of word lines respectively connected to control electrodes of the memory cell transistors along corresponding rows of the memory cell array;
a plurality of bit lines respectively connected to other main electrodes of the memory cell transistors along corresponding columns of the memory cell array;
a data line for selectively outputting a potential on the bit lines;
a select transistor of a first conductivity type having a first main electrode connected to a corresponding one of the bit lines, an other main electrode connected to the data line, and a control electrode having a corresponding select signal input thereto; and
a precharge transistor of a second conductivity type having a first main electrode connected to the corresponding one of the bit lines, an other main electrode connected to a second power line, and a control electrode having the corresponding select signal input thereto,
wherein the select transistor and the precharge transistor are both controlled by the corresponding select signal.

2. A semiconductor storage device comprising:
a memory cell array having a plurality of memory cell transistors arranged in a matrix form and having storage values written therein by connecting/disconnecting first main electrodes of the memory cell transistors to/from a first power line;
a plurality of word lines respectively connected to control electrodes of the memory cell transistors along corresponding rows of the memory cell array;
a plurality of bit lines respectively connected to other main electrodes of the memory cell transistors along corresponding columns of the memory cell array;
a data line for selectively outputting a potential on the bit lines;
a select transistor having a first main electrode connected to a corresponding one of the bit lines, an other main electrode connected to the data line, and a control electrode having a corresponding select signal input thereto; and
a precharge circuit including having a precharge transistor having a first main electrode connected to the corresponding one of the bit lines and an other main electrode connected to a second power line, and a precharge control circuit for causing the precharge transistor to turn on only when the corresponding select signal represents non-selection and a difference between a potential on the corresponding one of the bit lines and a potential on the second power line is greater than a predetermined value.

3. A semiconductor storage device according to claim 2, wherein the precharge transistor has a same conductivity type as the select transistor, and the precharge control circuit is a NAND gate that supplies to the precharge transistor an output responsive to an inversion of a potential on the corresponding one of the bit lines and the corresponding select signal.

4. A semiconductor storage device according to claim 2, wherein the precharge transistor has a conductivity type opposite to a conductivity type of the select transistor, and the precharge control circuit is a NOR gate that supplies to the precharge transistor an output responsive to a potential on the corresponding one of the bit lines and the corresponding select signal.

5. A semiconductor storage device according to claim 1, wherein the first power line receives a ground potential and the second power line receives a power source potential.

6. A semiconductor storage device according to claim 1, wherein the select transistor is an nMOS transistor and the precharge transistor is a pMOS transistor.

7. A semiconductor storage device according to claim 1, wherein the select transistor is a pMOS transistor and the precharge transistor is an nMOS transistor.

8. A semiconductor storage device according to claim 2, wherein the first power line receives a ground potential and the second power line receives a power source potential.

9. A semiconductor storage device according to claim 8, wherein said predetermined value is a value corresponding to a half of said power source potential.

10. A semiconductor storage device according to claim 3, wherein said precharge transistor is a pMOS transistor.

11. A semiconductor storage device according to claim 4, wherein said precharge transistor is an nMOS transistor.

* * * * *